US012672455B2

(12) United States Patent
Choi et al.

(10) Patent No.: US 12,672,455 B2
(45) Date of Patent: Jun. 30, 2026

(54) DISPLAY DEVICE INCLUDING LIGHT EMITTING ELEMENT

(71) Applicant: LG Display Co., Ltd., Seoul (KR)

(72) Inventors: Hong Seok Choi, Gumi-si (KR); Ju Hyuk Kwon, Seoul (KR); Shin Young Jeong, Seoul (KR); Hyun Jin Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 706 days.

(21) Appl. No.: 17/976,587

(22) Filed: Oct. 28, 2022

(65) Prior Publication Data

US 2023/0217766 A1 Jul. 6, 2023

(30) Foreign Application Priority Data

Dec. 31, 2021 (KR) ........................ 10-2021-0194734

(51) Int. Cl.
| | |
|---|---|
| *H10K 50/13* | (2023.01) |
| *H10D 86/40* | (2025.01) |
| *H10D 86/60* | (2025.01) |
| *H10K 59/121* | (2023.01) |
| *H10K 59/35* | (2023.01) |
| *H10K 59/38* | (2023.01) |

(52) U.S. Cl.
CPC ......... *H10K 59/353* (2023.02); *H10D 86/423* (2025.01); *H10D 86/60* (2025.01); *H10K 50/13* (2023.02); *H10K 59/1213* (2023.02); *H10K 59/38* (2023.02)

(58) Field of Classification Search
CPC .. H10K 50/13; H10K 59/353; H10K 59/1213; H10K 59/38; H10D 86/60; H10D 86/423
See application file for complete search history.

(56) References Cited

U.S. PATENT DOCUMENTS

| | | | |
|---|---|---|---|
| 2018/0047946 A1* | 2/2018 | Tsuda | G02F 1/1368 |
| 2018/0331320 A1* | 11/2018 | Su | H10K 50/844 |
| 2019/0096960 A1* | 3/2019 | Lee | H10K 50/805 |
| 2019/0165323 A1* | 5/2019 | Jo | H10K 50/81 |
| 2019/0198788 A1* | 6/2019 | Park | H10K 50/19 |
| 2020/0212356 A1* | 7/2020 | Kim | H10K 59/122 |
| 2020/0303685 A1* | 9/2020 | Jang | H10K 50/11 |
| 2021/0399068 A1* | 12/2021 | Kim | H10K 59/8792 |

* cited by examiner

*Primary Examiner* — Jeff W Natalini
*Assistant Examiner* — Ian Isaac Degrasse
(74) *Attorney, Agent, or Firm* — Seed Intellectual Property Law Group LLP

(57) ABSTRACT

Disclosed is a display device including a substrate at an exit side, first to third color subpixels provided on the substrate, each of the color subpixels having a thin film transistor, first to third color filters provided respectively at the first to third color subpixels, first to third anodes provided respectively on the first to third color filters so as to be connected to the thin film transistors, an emission unit commonly provided at the first to third color subpixels on the first to third anodes, the emission unit including at least two blue fluorescent stacks and two phosphorescent stacks, and a cathode provided on the emission unit, wherein the first to third color subpixels constitute a basic unit, and a third color subpixel of an n-th basic unit neighbors a first color subpixel of an (n+1)-th basic unit in the same row or column on the substrate.

20 Claims, 6 Drawing Sheets

DISPLAY DEVICE INCLUDING LIGHT EMITTING ELEMENT

CROSS-REFERENCE TO RELATED APPLICATION

This application claims the benefit of and priority to Korean Patent Application No. 10-2021-0194734, filed on Dec. 31, 2021, which is hereby incorporated by reference as if fully set forth herein.

BACKGROUND

Technical Field

The present disclosure relates to a display device, and more particularly to a display device capable of expressing a white color without a white subpixel through a stack structure with improved efficiency.

Description of the Related Art

In recent years, a light emitting display device having a light emitting element in a display panel has been considered as a competitive application in order to achieve compaction of the device and vivid color display without necessity of a separate light source.

Higher efficiency is required for a light emitting element used in a light emitting display device in order to provide high image quality.

Meanwhile, a tandem type element configured such that emission layers that emit different colors of light are provided in different stacks is considered as the light emitting element.

In the tandem type element, red, green, blue, and white subpixels are combined to display a white color. In this case, however, there are problems related to color shift and aging due to gradation.

BRIEF SUMMARY

Accordingly, the present disclosure is directed to a display device including a light emitting element that substantially obviates one or more problems due to limitations and disadvantages of the related art.

It is a technical benefit of the present disclosure to provide a light emitting device having an excellent efficiency without having a white sub-pixel by changing an internal stack structure.

In a display device according to the present disclosure, a phosphorescent emission layer is independent for each stack in order to improve color purity, and a plurality of blue fluorescent stacks configured to emit blue fluorescence is provided so as to correspond to a phosphorescent stack, whereby it is possible to express a white color through a combination of red, green, and blue subpixels without separate division of a white subpixel when viewed in plan.

To achieve these benefits and other advantages and in accordance with the purpose of the disclosure, as embodied and broadly described herein, a display device includes a substrate at an exit side, first to third color subpixels provided on the substrate, each of the first to third color subpixels having a thin film transistor, first to third color filters provided respectively at the first to third color subpixels, first to third anodes provided respectively on the first to third color filters so as to be connected to the thin film transistors, an emission unit commonly provided at the first to third color subpixels on the first to third anodes, the emission unit including at least two blue fluorescent stacks and two phosphorescent stacks configured to emit different colors of light, and a cathode provided on the emission unit, wherein the first to third color subpixels constitute a basic unit, a plurality of basic units is repeated in plan, and a third color subpixel of an n-th basic unit neighbors a first color subpixel of an (n+1)-th basic unit in the same row or column on the substrate.

It is to be understood that both the foregoing general description and the following detailed description of the present disclosure are explanatory and are intended to provide further explanation of the disclosure.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
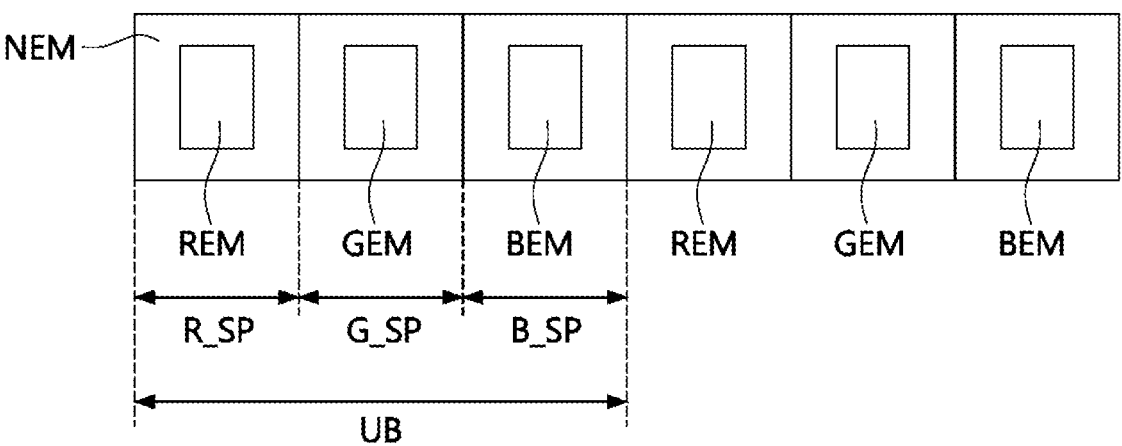
FIG. 1 is a plan view showing sequential disposition of color subpixels in a display device according to the present disclosure.

Reference will now be made in detail to embodiments of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein may be omitted when the same may obscure the subject matter of the present disclosure. In addition, the names of elements used in the following description are selected in consideration of clarity of description of the specification, and may differ from the names of elements of actual products.

The shape, size, ratio, angle, number, and the like shown in the drawings to illustrate various embodiments of the present disclosure are merely provided for illustration, and the disclosure is not limited to the content shown in the drawings. In the following description, detailed descriptions of technologies or configurations related to the present disclosure may be omitted so as to avoid unnecessarily obscuring the subject matter of the present disclosure. When terms such as "including," "having," and "comprising" are used throughout the specification, an additional component may be present, unless "only" is used. A component described in a singular form encompasses a plurality thereof unless particularly stated otherwise.

The components included in the embodiments of the present disclosure should be interpreted to include an error range, even if there is no additional particular description thereof.

In describing the variety of embodiments of the present disclosure, when terms describing positional relationships such as "on," "above," "under" and "next to" are used, at least one intervening element may be present between the two elements, unless "immediately" or "directly" is used.

In describing the variety of embodiments of the present disclosure, when terms related to temporal relationships, such as "after," "subsequently," "next" and "before," are used, the non-continuous case may be included, unless "immediately" or "directly" is used.

In describing the variety of embodiments of the present disclosure, terms such as "first" and "second" may be used to describe a variety of components, but these terms only aim to distinguish the same or similar components from one another. Accordingly, throughout the specification, a "first" component may be the same as a "second" component within the technical concept of the present disclosure, unless specifically mentioned otherwise.

Features of various embodiments of the present disclosure may be partially or completely coupled to or combined with each other, and may be variously inter-operated with each other and driven technically. The embodiments of the present disclosure may be carried out independently from each other, or may be carried out together in an interrelated manner.

Hereinafter, an organic light emitting display device will be mainly described as a display device according to the present disclosure; however, the material for a light emitting element used in the display device is not limited to an organic material. Depending on circumstances, a light emitting material may be an organic material, an inorganic material, such as a quantum dot semiconductor or a nitride semiconductor, or a compound of an organic material and an inorganic material, such as perovskite.

Figure 2:
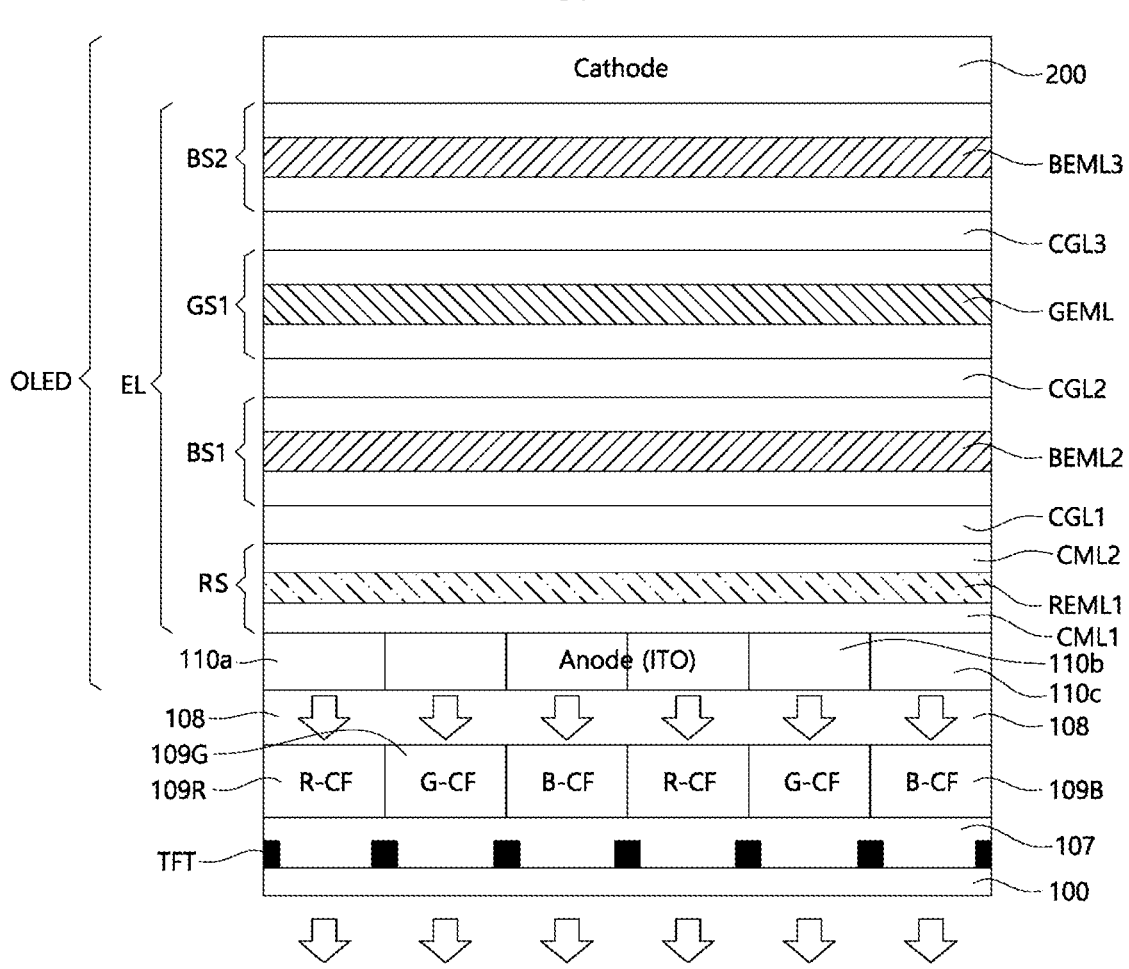
FIG. 2 is a sectional view taken along a horizontal line of FIG. 1.

FIG. 1 is a plan view showing sequential disposition of color subpixels in a display device according to the present disclosure, and FIG. 2 is a sectional view taken along a horizontal line of FIG. 1.

As shown in FIGS. 1 and 2, the display device according to the present disclosure includes a substrate 100 at an exit side, from which light is directly emitted outside without another substrate, first to third color subpixels R_SP, G_SP, and B_SP provided on the substrate, each of the first to third color subpixels having a thin film transistor TFT, first to third color filters 109R, 109G, and 109B provided respectively at the first to third color subpixels R_SP, G_SP, and B_SP, and first to third anodes 110a, 110b, and 110c provided respectively on the first to third color filters so as to be connected to the thin film transistors.

In addition, the display device according to the present disclosure further includes an emission unit EL commonly provided at the first to third color subpixels R_SP, G_SP, and B_SP on the first to third anodes 110a, 110b, and 110c, the emission unit (or emission structure) including at least two blue fluorescent stacks BS1 and BS2 and two phosphorescent stacks GS (or GS1) and RS configured to emit different colors of light, and a cathode 200 provided on the emission unit EL.

In addition, the first to third color subpixels R_SP, G_SP, and B_SP constitute a basic unit UB, and a plurality of basic units UB is repeated in plan. In the same row or the same column on the substrate 100, the third color subpixel B_SP of the n-th basic unit UB may neighbor the first color subpixel R_SP of the (n+1)-th basic unit UB.

For example, on the assumption that the first to third color subpixels R_SP, G_SP, and B_SP are red, green, and blue subpixels, respectively, the blue subpixel neighbors the next red subpixel, and three different color subpixels are repeatedly disposed in plan. That is, no white subpixel is used excluding the red, green, and blue subpixels.

In the display device according to the present disclosure, the white subpixel is not merely omitted, and light emitted from the emission unit EL is capable of expressing a predetermined level of pure color. In particular, green emission, which has the greatest influence on white luminance, is implemented by using a single green phosphorescent layer in an independent stack. Furthermore, a green phosphorescent stack is provided as an independent stack and a red phosphorescent stack is also provided as an independent stack, whereby it is possible to prevent a problem in that color coordinate characteristics are changed at the time of gradation change (high gradation→low gradation or low gradation→high gradation) occurring as the result of phosphorescent emission layers being provided in one stack of a two-stack or three-stack tandem element and an issue of a compensation driving circuit due to change in color coordinates depending on aging. In particular, even though change in color coordinates depending on aging in the two-stack or three-stack tandem element can be solved through compensation driving, change characteristics are not equalized depending on product or emission position in the product, whereby non-uniformity may occur in a panel even when the compensation driving circuit is applied.

In the display device according to the present disclosure, a phosphorescent stack is provided as an independent stack so as to emit an independent phosphorescent color, and, when a white color is expressed through combination, two or more blue fluorescent stacks are provided in the emission unit EL so as to correspond to high-efficiency phosphorescent emission. The phosphorescent stack includes a red phosphorescent stack RS and a green phosphorescent stack GS.

FIG. 2 shows an example in which the emission unit EL includes four stacks, wherein a red phosphorescent stack RS, a first blue fluorescent stack BS1, a green phosphorescent stack GS1, and a second blue fluorescent stack BS2 are sequentially disposed from the first to third anodes 110a, 110b, and 110c.

Each of the stacks RS, BS1, GS1, and BS2 includes an emission layer REML1, GEML, BEML2, or BEML3, a hole transport common layer under the emission layer, and an electron transport common layer on the emission layer. The hole transport common layer may include a hole injection layer, an electron blocking layer, and a hole transport layer, and the electron transport common layer may include a hole blocking layer, an electron transport layer, and an electron injection layer.

For example, the red phosphorescent stack RS may include a red phosphorescent emission layer REML having an emission peak at a wavelength of 600 nm to 650 nm, a common layer provided thereunder, and a common layer provided thereon. The green phosphorescent stack GS may include a green phosphorescent emission layer having an emission peak at a wavelength of 510 nm to 590 nm, a common layer provided thereunder, and a common layer provided thereon. Each of the first and second blue fluorescent stacks BS1 and BS2 may include a first blue fluorescent emission layer BEML1 or a second blue fluorescent emission layer BEML2, a common layer provided thereunder, and a common layer provided thereon. Each of the first and second blue fluorescent emission layers BEML1 and BEML2 may have an emission peak at a wavelength of 420 nm to 490 nm.

The first and second blue fluorescent emission layers BEML1 and BEML2 may be identical to each other or may be slightly different in emission peak from each other as needed.

Meanwhile, in the display device according to the present disclosure, light generated from the emission unit EL is emitted outside through the substrate 100 via the first to third anodes 110a, 110b, and 110c and the color filters 109R, 109G, and 109B, wherein red light, green light, and blue light are emitted outside while having selective wavelength transmittances of the subpixel-specific color filters 109R, 109G, and 109B. Consequently, the substrate 100, which is a transparent member, may be any one of a glass substrate and a transparent plastic film.

A passivation film 107 configured to protect the thin film transistor TFT may be provided between the substrate 100 and the color filters 109R, 109G, and 109B.

An overcoat layer 108 may be formed on the color filters 109R, 109G, and 109B to planarize the surface thereof, and the anodes 110a, 110b, and 110c of the subpixels may be formed thereon.

Meanwhile, the thin film transistor TFT may include at least one metal layer and an oxide semiconductor layer. Here, the metal layer may be a stack (MoOx/Cu) of a molybdenum oxide (MoOx) film and a copper film, thereby exhibiting low reflection characteristics. Even though no circular polarizer is provided at the rear of the substrate 100 or outside the substrate, therefore, it is possible to prevent reflection of external light due to the low reflection characteristics of the metal layer constituting the thin film transistor TFT.

Meanwhile, the rear of the substrate 100 may be exposed to the air. This means that a polarizing film configured to halve transmittance of light, such as a circular polarizer or a polarizing plate, is not used at the rear of the substrate 100.

In the display device according to the present disclosure, pure color transmittances of red light, green light, and blue light are improved through the stack structure of a light emitting element OLED. In addition, the metal layer included in the thin film transistor TFT is made of a low reflectivity material, and therefore reflection of external light may be prevented by the metal layer even though no separate polarizing film is provided.

Also, in the display device according to the present disclosure, different phosphorescent emission layers may be provided in independent stacks, whereby it is possible to improve color efficiency of each phosphorescent color and to complement color efficiencies of the green and red colors, which have a great influence on white luminance.

In addition, the green and red phosphorescent stacks are separated from each other, and a plurality of blue stacks is provided so as to correspond in efficiency to a single phosphorescent stack, whereby it is possible to improve pure color efficiency and to improve color gamut. Consequently, the circular polarizer may be removed.

An improved four-stack element structure may be applied to implement a white color without a separate white subpixel. Consequently, no signal change for the white subpixel is required, and therefore driving circuit cost may be reduced.

The value of luminance applied using the same current is increased, and therefore power consumption is reduced, compared to a three-stack structure in which a phosphorescent emission layer is provided in one stack.

Figure 3:
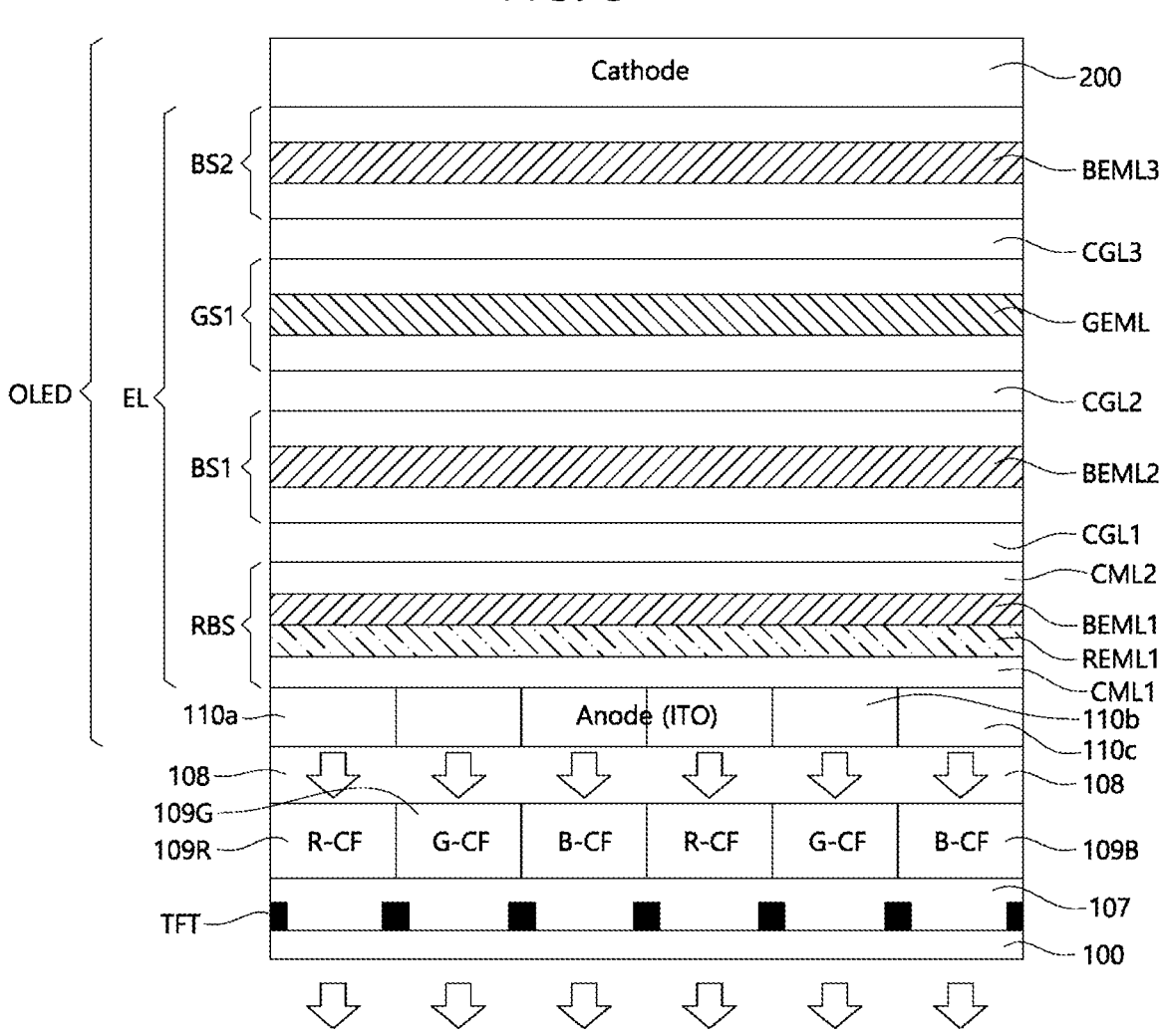
FIG. 3 is a sectional view showing a display device according to another embodiment of the present disclosure.

FIG. 3 is a sectional view showing a display device according to another embodiment of the present disclosure.

In the display device according to the other embodiment of the present disclosure shown in FIG. 3, a red-blue stack RBS is used instead of the red phosphorescent stack of FIG. 2, wherein a red phosphorescent emission layer REML1 and a first blue fluorescent emission layer BEML1 are provided adjacent to each other, and the blue fluorescent emission layer BEML1 is included in the red-blue stack RBS constituting an emission unit EL.

Since the blue fluorescent emission layer BEML1 uses excitons, which are not used in the red phosphorescent emission layer REML1, for emission, it is possible to increase blue efficiency without lowering of red efficiency, compared to the structure of FIG. 2.

Green and red luminance efficiencies are improved through application of the phosphorescent stack. When blue efficiency is insufficient in a two-stack structure, therefore, the structure of the display device according to the embodiment shown in FIG. 3 may be used.

Figure 4:
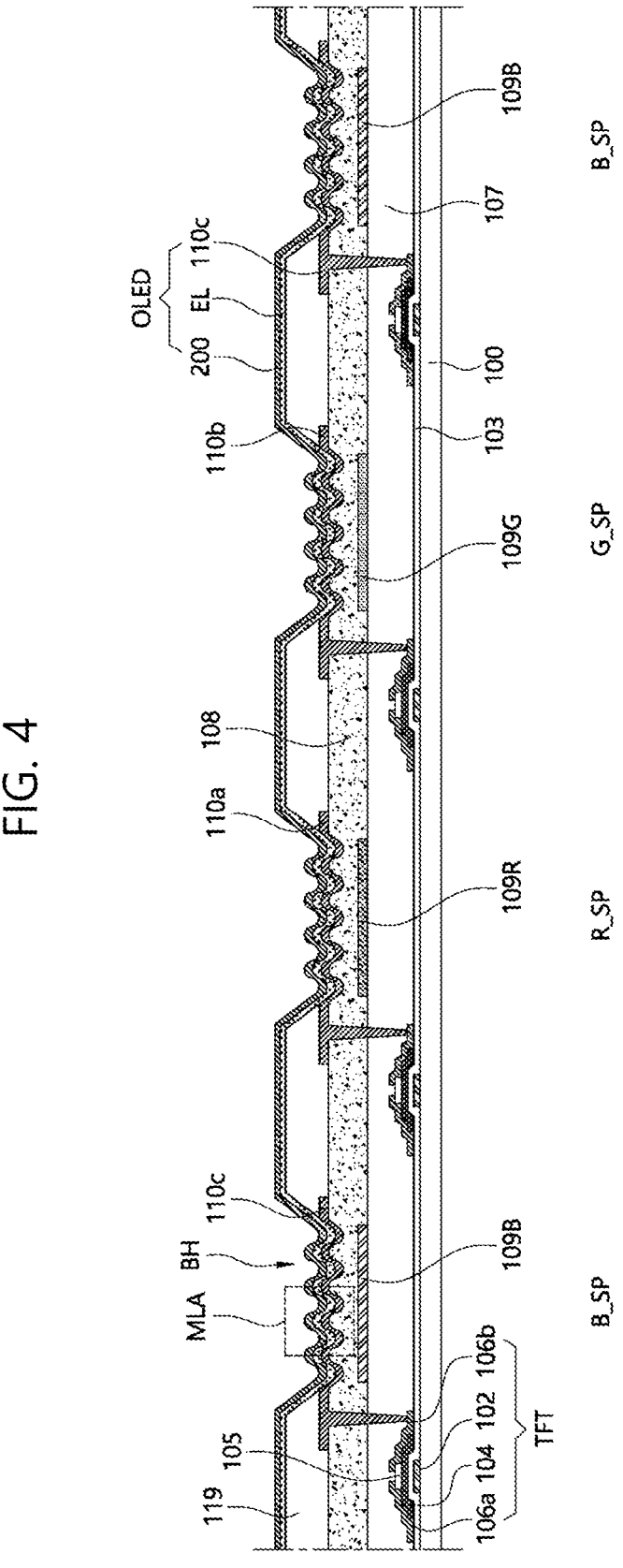
FIG. 4 is a sectional view showing a display device according to a further embodiment of the present disclosure.

FIG. 4 is a sectional view showing a display device according to a further embodiment of the present disclosure.

In the display device according to the present disclosure shown in FIG. 4, red, green, and blue color subpixels R_SP, G_SP, and B_SP include a red filter 109R, a green filter 109G, and a blue filter 109B, respectively. An irregular pattern is provided at the surface of an overcoat layer 108 configured to cover the color filters 109R, 109G, and 109B, and a light emitting element OED is formed along the irregular pattern, whereby a micro-lens array (MLA) effect is achieved through the irregular pattern. The light emitting element OED is formed along the irregular pattern, whereby the ratio of emission area to planar area of an emission portion EM of each subpixel is increased, and light is discharged after being reflected and re-reflected in the irregular pattern.

First to third anodes 110a, 110b, and 110c are located on the overcoat layer 108, edges of the first to third anodes 110a, 110b, and 110c are covered by a bank 119, and emission portions RM, GEM, and BEM shown in FIG. 1 may be defined by bank holes BH formed in the bank 119.

The construction of the thin film transistor TFT will be described in detail with reference to FIG. 4.

As an example, the thin film transistor TFT includes a gate electrode 102, a semiconductor layer 104, and a source electrode 106a and a drain electrode 106b connected to opposite sides of the semiconductor layer 104. A channel passivation layer 105 configured to prevent direct connection between the source and drain electrodes 106a and 106b and the semiconductor layer 104 may be further provided on the portion of the semiconductor layer 104 at which a channel is located.

A gate insulating film 103 is provided between the gate electrode 102 and the semiconductor layer 104.

For example, the semiconductor layer 104 may be made of any one of an oxide semiconductor, amorphous silicon, and polysilicon or a combination of two or more thereof. For example, when the semiconductor layer 104 is made of an oxide semiconductor, it is possible to reduce heating temperature necessary to form the thin film transistor, and therefore the degree of freedom in using the substrate 100 is high, which is advantageous in application to a flexible display device.

In addition, the drain electrode 106*b* of the thin film transistor TFT may be connected to the first to third anodes 110*a*, 110*b*, and 110*c* in contact holes provided in the passivation film 107 and the overcoat layer 108.

The passivation film 107 is provided to primarily protect the thin film transistor TFT, and color filter layers 109R, 109G, and 109B may be provided thereon.

In the display device, a light emitting element configured to implement a white color is required, and each of the color filters 109R, 109G, and 109B transmits light having a corresponding wavelength for each subpixel based on selective wavelength transmittance, whereby various colors may be implemented.

The plurality of subpixels includes a red subpixel, a green subpixel, and a blue subpixel provided for the first to third color filter layers 109R, 109G, and 109B, whereby white light passing through the first electrode 110 is transmitted based on the wavelength thereof.

Here, the light emitting element OLED is characterized in that the light emitting element includes an anode 110, which is transparent, a second electrode 200 opposite the anode, the second electrode being a reflective electrode, and in that a non-blue phosphorescent emission layer and a blue fluorescent emission layer abut each other between the hole transport layer and the electron transport layer in any one of stacks (RBS as shown in FIG. 3) divided by charge generation layers CGL1 and CGL2 and CGL3 between the first and second electrodes 110 and 200, as shown in FIG. 3.

The anode 110 is divided for each subpixel, the other layers of the white light emitting element OLED are integrally provided over a display area without subpixel-specific division.

Here, reference numeral 119 indicates banks, and BH between the banks indicates bank holes. Light is emitted from areas open through the bank holes BH, and the bank holes define the emission portions REM, GEM, and BEM of the subpixels shown in FIG. 1.

Hereinafter, characteristics of a first experimental example, a third experimental example, and a fifth experimental example, each of which includes a three-stack type light emitting element and has R, G, B, and W subpixels, and characteristics of a second experimental example, a fourth experimental example, and a sixth experimental example, each of which includes the four-stack type light emitting element shown in FIG. 2, will be described for comparison. The display device according to the present disclosure corresponds to the second experimental example, the fourth experimental example, and the sixth experimental example.

First, the light emitting element according to the first experimental example will be described.

The light emitting element according to the first experimental example has red, green, blue, and white subpixels when viewed in plan, and the white subpixel has no color filter.

An emission unit provided on an anode has three stacks, wherein blue fluorescent stacks are provided adjacent to the anode and a cathode, and a red emission layer, a yellowish green emission layer, and a green emission layer are provided so as to abut each other in an intermediate stack.

In contrast, the second experimental example has no white subpixel and has only red, green, and blue subpixels. When first to third anodes are formed respectively on the red, green, and blue subpixels, an emission unit EL includes a red phosphorescent stack RS, a first blue fluorescent stack BS1, a green phosphorescent stack GS1, and a second blue fluorescent stack BS2 sequentially disposed from the first to third anodes 110*a*, 110*b*, and 110*c*

Each of the stacks RS, BS1, GS1, and BS2 includes an emission layer REML1, BEML1, GEML, or BEML2, a hole transport common layer under the emission layer, and an electron transport common layer on the emission layer. The hole transport common layer may include a hole injection layer, an electron blocking layer, and a hole transport layer, and the electron transport common layer may include a hole blocking layer, an electron transport layer, and an electron injection layer.

For example, the red phosphorescent stack RS may include a red phosphorescent emission layer REML having an emission peak at a wavelength of 600 nm to 650 nm, a common layer provided thereunder, and a common layer provided thereon. The green phosphorescent stack GS may include a green phosphorescent emission layer having an emission peak at a wavelength of 510 nm to 590 nm, a common layer provided thereunder, and a common layer provided thereon. Each of the first and second blue fluorescent stacks BS1 and BS2 may include a first blue fluorescent emission layer BEML1 or a second blue fluorescent emission layer BEML2, a common layer provided thereunder, and a common layer provided thereon. Each of the first and second blue fluorescent emission layers BEML1 and BEML2 has an emission peak at a wavelength of 420 nm to 490 nm.

Figure 5:
FIG. 5 is a graph showing emission spectra of light emitting elements according to a first experimental example and a second experimental example.
Figure 5:
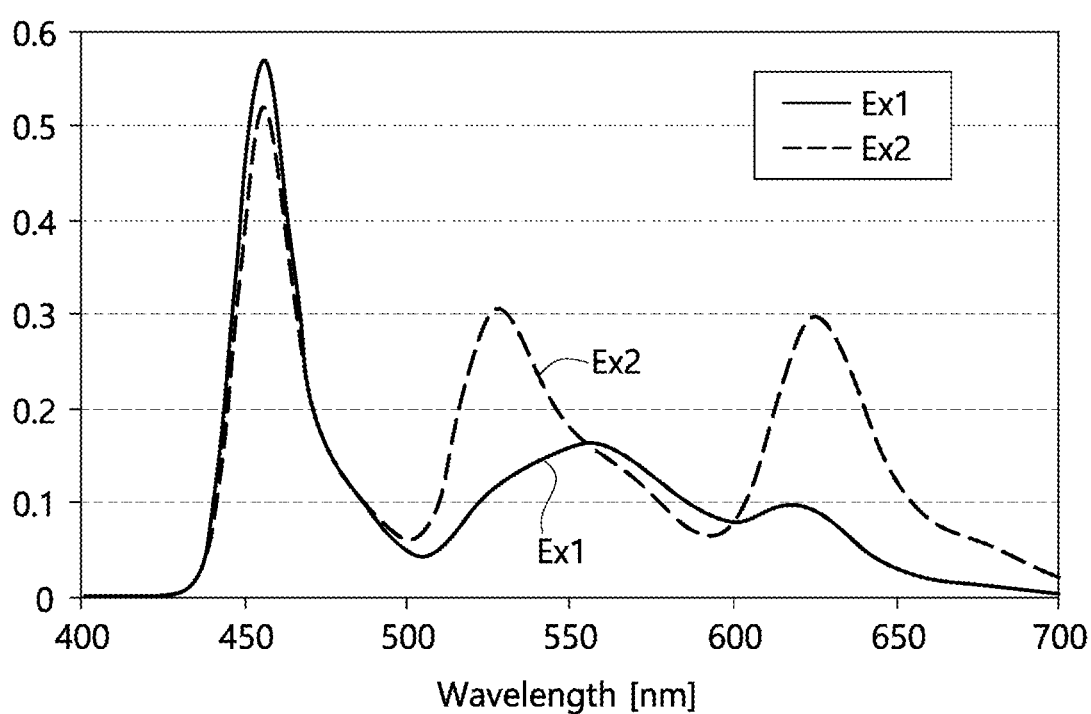

FIG. 5 is a graph showing emission spectra of light emitting elements according to a first experimental example (Ex1) and a second experimental example (Ex2).

Referring to Table 1 and FIG. 5, in the second experimental example (Ex2), to which a planar structure having four stacks and three color subpixels, i.e., red, green, and blue subpixels, is applied, red efficiency is 238% of red efficiency in the first experimental example (Ex1), and green efficiency is 155% of green efficiency in the first experimental example (Ex1). That is, it can be seen that, in the second experimental example (Ex2), pure color efficiency is greatly improved by changing the structure of the light emitting element.

Also, it can be seen that, in the second experimental example (Ex2), a DCI overlap ratio or BT2020, which is an actual color gamut evaluation criterion, is improved, compared to the first experimental example (Ex1), and that color gamut in the structure according to the present disclosure is also improved, compared to a structure having three stacks and a white subpixel.

Efficiency and color coordinates shown in Table 1 are values obtained after passing through the color filter in each element structure. That is, it may be considered from the results that, in the four-stack element structure according to the present disclosure, it is possible to omit a white subpixel.

TABLE 1

| Classification | Subpixel | Ex1 (3 Stacks + RGBW subpixels) | Ex2 (4 Stacks + RGB subpixels) |
|---|---|---|---|
| Efficiency | R | 9.0 | 21.4 |
| (Cd/A) | G | 31.8 | 49.4 |
| | B | 4.35 | 4.80 |
| | W | 77.1 | NA |
| Color coordinates | Rx | 0.681 | 0.696 |
| (CIE1931) | Ry | 0.319 | 0.304 |
| | Gx | 0.271 | 0.224 |
| | Gy | 0.675 | 0.718 |
| | Bx | 0.146 | 0.146 |
| | By | 0.042 | 0.049 |
| | Wx | 0.288 | NA |
| | Wy | 0.296 | NA |

TABLE 1-continued

| Classification | Subpixel | Ex1 (3 Stacks + RGBW subpixels) | Ex2 (4 Stacks + RGB subpixels) |
|---|---|---|---|
| Color gamut | DCI | 98.7% | 99.5% |
| (Overlap ratio) | BT2020 | 77.8% | 86.5% |

Figures 6, 7:
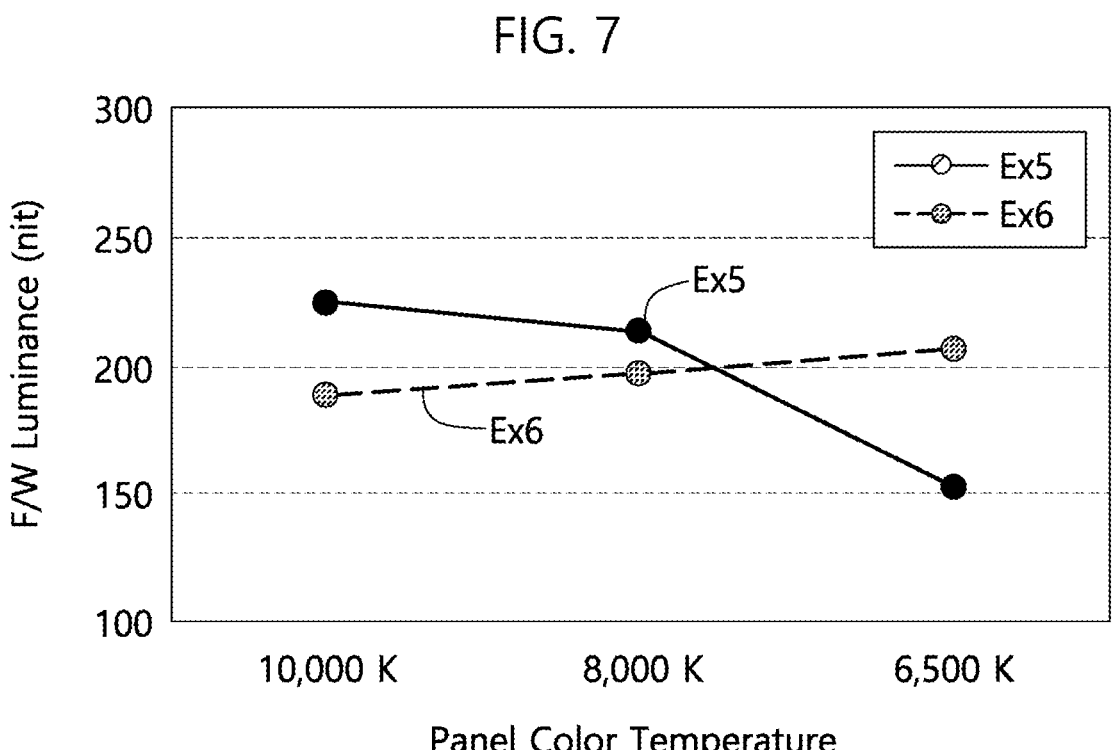
FIG. 6 is a graph showing color-specific maximum luminance of display devices according to a third experimental example and a fourth experimental example.
FIG. 7 is a graph showing panel color temperature-specific full window luminance of display devices according to a fifth experimental example and a sixth experimental example.

FIG. 6 is a graph showing color-specific maximum luminance of display devices according to a third experimental example and a fourth experimental example.

TABLE 2

| Classification | | Ex3 | Ex4 |
|---|---|---|---|
| Number of stacks | | 3 Stacks | 4 Stacks |
| Subpixel structure | | RGBW | RGB |
| Circular polarizer | | Present | Absent |
| F/W color temperature (Color coordinates) | | 10,000 K (0.281, 0.288) | |
| ACL | Color | Luminance@Full Window [Cd/A] | |
| ACL = 15.1 A | R | 49.7 | 281.2 |
| | G | 175.4 | 650.3 |
| | B | 24.0 | 63.2 |
| | Cyan | 111.2 | 318.1 |
| | Magenta | 38.6 | 141.1 |
| | Yellow | 113.7 | 495.1 |
| ACL = 9.2 A | White | 223.5 | 188.4 |

Panel section structures according to the third experimental example (Ex3) and the fourth experimental example (Ex4) were assumed, and color-specific maximum luminance of each panel was calculated. In the fourth experimental example (Ex4), it is possible to remove a white subpixel, and when low reflectivity wiring, such as MoOx/Cu, is applied to a thin film transistor array, external light reflection is prevented without using a circular polarizer. Consequently, it is possible to prevent visibility of external light. As shown in Table 2 and FIG. 6, in the structure according to the fourth experimental example (Ex4), it is possible to implement luminance of at least 2 times or more when all colors excluding a white color are displayed. When a white color is displayed, it seems that luminance of the third experimental example (Ex3) having the white subpixel is somewhat high, but the difference therebetween is insignificant. In consideration of the fact that a plurality of subpixels must be turned on in order to express cyan, magenta, and yellow, which are secondary colors, in addition to primary colors, such as red, green, and blue, the fourth experimental example (Ex4) of the present disclosure is significant in displaying various colors, since luminance of the secondary colors is increased from two to five times in the fourth experimental example (Ex4).

In addition, since the display device according to fourth experimental example (Ex4) of the present disclosure has high efficiency in the element structure, low power consumption is achieved, whereby the lifetime of the display device is increased.

Also, in the display device according to the present disclosure, the subpixel is omitted from the substrate in addition to advantages of luminance and power consumption, and therefore it is possible to solve a problem in that a driving circuit or a circular polarizer required by the third experimental example (Ex3) having the white subpixel must be provided. In addition, the display device according to fourth experimental example (Ex4) of the present disclosure is free from a problem in that aging of the white subpixel or poor fluctuation of color coordinates occurs at the time of gradation change in the third experimental example (Ex3).

FIG. 7 is a graph showing panel color temperature-specific full window luminance of display devices according to a fifth experimental example and a sixth experimental example.

There are various requirements for a display device.

For example, when the display device is a TV, a high color temperature of 10,000 K is required, whereas a relatively low color temperature of 6,500 K is required for a laptop computer or a PC monitor. Even for the TV, F/W of 6,500 K may be used depending on personal preference or DCI standards.

When a required color temperature of the display panel is lowered, as shown in Table 3, luminance is abruptly reduced due to low red efficiency in the fifth experimental example (Ex5: 3 Stacks+RGBW), whereas red efficiency is high and thus full window luminance is increased in the sixth experimental example (Ex6) of the present disclosure, as can be seen from FIG. 5 and Table 1.

TABLE 3

| | Full window color temperature | | |
|---|---|---|---|
| | 10,000 K | 8,000 K | 6,500 K |
| Ex5: 4 Stacks + RGB (without polarizer) | 188.4 | 196.8 | 205.7 |
| Ex6: 3 Stacks + RGBW (with polarizer) | 223.5 | 213.4 | 152.2 |

That is, as shown in FIGS. 2 to 4, luminance of light that has sequentially passed through the color filter CR and the substrate 100 after being emitted from the emission unit EL of the light emitting element may be increased at a color temperature lowered from 10,000 K to 6,500 K.

The newest OLED TV includes the construction (a WOLED element having three stacks and RGBW subpixels) of the first experimental example and a circular polarizer. Although power consumption of the white subpixel region may be reduced through the white subpixel, it is necessary to design a driving circuit for driving the same, and improvement in pure color luminance is limited in the first experimental example.

When a white light emitting element is applied to the display device, process burden due to driving of four subpixels and color shift of the white subpixel due to aging or gradation change become problems, and therefore efforts and constant attempts to remove the white subpixel have been made.

In the display device according to the present disclosure, a four-stack white light emitting element in which a red phosphorescent stack and a green phosphorescent stack are independently provided is applied to the display device, a TFT substrate having a low reflectivity structure provided at wiring is also applied to the display device, whereby high efficiency is achieved using only the red, green, and blue subpixels, and therefore it is possible to remove the white subpixel.

In the structure having three stacks and RGBW subpixels, as in the first experimental example (Ex1), a driving circuit for driving the white subpixel is necessary. As a result, the aperture ratio is reduced, whereby current density in red, green, and blue is increased, and therefore the lifetime of the panel is reduced. In addition, a driving driver IC configured to drive the white subpixel is necessary to be provided in a percentage of 33%, and a circuit for converting an input RGB signal into an RGBW signal and a memory for storing the RGBW signal are further necessary, whereby cost is increased.

In the white subpixel, color change occurs depending on driving time or gradation change. That is, white light emitted from the white subpixel is changed depending on change in efficiency of the blue fluorescent stack and the phosphorescent stack based on gradation, and intensity of red, green, or red and yellowish green constituting the phosphorescent emission layer, i.e., applied current density. The element is developed such that the change is minimized; however complete inhibition is impossible. Fluorescence and phosphorescence are not equal to each other in terms of decrease in luminance depending on driving time. Consequently, change in color coordinates depending on gradation and change in color coordinates due to aging are solved through compensation driving. Since such change is not completely identical depending on product and emission position in the product, however, non-uniformity occurs in the panel depending on circumstances.

In the present disclosure, in patterning technology having verified mass productivity, a white subpixel is omitted through combination of a white light emitting element and a color filter unit when viewed in plan, and only three color subpixels, such as red, green, and blue subpixels. Even though the white subpixel is omitted, it is possible to secure sufficiently high efficiency for red, green, and blue, and therefore it is possible to implement a structure without reduction in bright room contrast ratio.

When describing the construction of the element of the display device according to the present disclosure with reference to FIGS. 2 and 3, the light emitting element OLED capable of implementing a white color, the green phosphorescent stack GS and the red phosphorescent red stack RS are separated from each other, whereby phosphorescent emission layers are divided from each other, and two or more blue fluorescent stacks are provided, whereby the display device has a structure having four or more stacks, unlike the first experimental example (Ex1). In this structure, pure color efficiency of red and green is further improved without color shift at the time of gradation change, whereby it is possible to implement higher luminance.

In addition, since the white subpixel is omitted when the color filter unit is formed, it is possible to increase the aperture ratio of each of the red, green, and blue subpixels through the CF and OC layers, whereby the lifetime of the panel is increased when an image in which pure colors are greatly driven is applied, and it is possible to solve various problems caused from the structure having the white subpixel, as previously described.

Also, in the display device according to the present disclosure, the white subpixel is deleted, and therefore it is possible to remove a circular polarizer. In this case, reflection from the thin film transistor array may reduce image quality, and therefore it is possible to solve this problem by including a low reflectivity metal layer (e.g., MoOx/Cu) as at least one metal layer of the thin film transistor array. Consequently, the circular polarizer is removed through the use of the low reflectivity metal layer, whereby luminance of the red, green, blue, and white pattern is increased two or more fold.

In addition, depending on circumstances, a microlens structure may be formed at the surface of the overcoat layer in order to further improve efficiency. Also, in order to improve the bright room contrast ratio, an anti-reflection or low reflectivity film may be applied to the entire surface of the substrate at the exit side, and a transparent film including a light absorption layer having higher transmittance than circular polarization may be applied thereto depending on circumstances.

In addition, the blue fluorescent emission layer abutting the red phosphorescent emission layer is further included in the red stack, and emission interference is prevented due to the difference in mechanism therebetween, whereby it is possible to increase blue efficiency without reduction in red efficiency.

In the display device according to the present disclosure, different phosphorescent emission layers may be provided in independent stacks, whereby it is possible to improve color efficiency of each phosphorescent color and to complement color efficiencies of the green and red colors, which have a great influence on white luminance.

In addition, the green and red phosphorescent stacks are separated from each other, and a plurality of blue stacks is provided so as to correspond in efficiency to a single phosphorescent stack, whereby it is possible to improve pure color efficiency and to improve color gamut. Consequently, the circular polarizer may be removed.

In addition, an improved four-stack element structure may be applied to implement a white color without a separate white subpixel. Consequently, no signal change for the white subpixel is required, and therefore driving circuit cost may be reduced.

The value of luminance applied using the same current is increased, and therefore power consumption is reduced, compared to a three-stack structure in which a phosphorescent emission layer is provided in one stack.

A display device according to an embodiment of a present disclosure may comprise a substrate at an exit side, first to third color subpixels on the substrate, each of the first to third color subpixels having a thin film transistor, first to third color filters provided respectively at the first to third color subpixels, first to third anodes provided respectively on the first to third color filters to be connected to the thin film transistors, an emission unit commonly provided at the first to third color subpixels on the first to third anodes, the emission unit comprising at least two blue fluorescent stacks and two phosphorescent stacks to emit different colors of light and a cathode on the emission unit. The first to third color subpixels constitute a basic unit, a plurality of basic units is repeated in plan, and a third color subpixel of an n-th basic unit neighbors a first color subpixel of an (n+1)-th basic unit in an identical row or an identical column on the substrate.

In a display device according to an embodiment of a present disclosure, the emission unit may comprise a red phosphorescent stack, a first blue fluorescent stack, a green phosphorescent stack, and a second blue fluorescent stack sequentially disposed from the first to third anodes in a direction toward the cathode. And each of the red phosphorescent stack, the first blue fluorescent stack, the green phosphorescent stack, and the second blue fluorescent stack may comprise an emission layer, a common layer provided under the emission layer, and a common layer provided on the emission layer.

In a display device according to an embodiment of a present disclosure, the emission unit may comprise a red-blue stack, a first blue fluorescent stack, a green phosphorescent stack, and a second blue fluorescent stack sequentially disposed from the first to third anodes in a direction toward the cathode. The red-blue stack may comprise a red phosphorescent emission layer and a first blue fluorescent emission layer.

In a display device according to an embodiment of a present disclosure, the thin film transistor may comprise at least one metal layer and an oxide semiconductor layer.

In a display device according to an embodiment of a present disclosure, the metal layer may be a stack of a molybdenum oxide (MoOx) film and a copper film.

In a display device according to an embodiment of a present disclosure, a rear of the substrate may be exposed to air.

A display device according to an embodiment of a present disclosure may further comprise an overcoat layer between the first to third color filters and the first to third anodes. The overcoat layer may be provided at a surface thereof abutting the first to third anodes with an irregular pattern.

In a display device according to an embodiment of a present disclosure, the first to third anodes, the emission unit, and the cathode may be formed along the irregular pattern of the overcoat layer.

In a display device according to an embodiment of a present disclosure, light from the emission unit is transmitted through the color filters, and the substrate, and luminance of passed light through the substrate may be increased at a color temperature lowered from 10,000 K to 6,500 K.

As is apparent from the above description, the display device according to the present disclosure has the following effects.

First, different phosphorescent emission layers may be provided in independent stacks, whereby it is possible to improve color efficiency of each phosphorescent color and to complement color efficiencies of the green and red colors, which have a great influence on white luminance.

Second, the green and red phosphorescent stacks are separated from each other, and a plurality of blue stacks is provided so as to correspond in efficiency to a single phosphorescent stack, whereby it is possible to improve pure color efficiency and to improve color gamut. Consequently, the circular polarizer may be removed.

Third, an improved four-stack element structure may be applied to implement a white color without a separate white subpixel. Consequently, no signal change for the white subpixel is required, and therefore driving circuit cost may be reduced.

Fourth, the value of luminance applied using the same current is increased, and therefore power consumption is reduced, compared to a three-stack structure in which a phosphorescent emission layer is provided in one stack.

While the embodiments of the present disclosure have been described with reference to the accompanying drawings, the present disclosure is not limited to the embodiments and may be embodied in various different forms, and those skilled in the art will appreciate that the present disclosure may be embodied in specific forms other than those set forth herein without departing from the technical idea and essential characteristics of the present disclosure. The disclosed embodiments are therefore to be construed in all aspects as illustrative and not restrictive.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a substrate;
first, second and third color subpixels on the substrate, each of the first, second and third color subpixels having a thin film transistor;
first, second and third color filters provided respectively at the first, second and third color subpixels;
first, second and third anodes provided respectively on the first, second and third color filters to be connected to the thin film transistors;
an emission unit commonly provided at the first, second and third color subpixels on the first, second and third anodes, the emission unit comprising at least two blue fluorescent stacks, a red phosphorescent stack and a green phosphorescent stack; and
a cathode on the emission unit, wherein
the first, second and third color subpixels constitute a basic unit,
a plurality of basic units is repeated in a plan view, and
a third color subpixel of an n-th basic unit neighbors a first color subpixel of an (n+1)-th basic unit in an identical row or an identical column on the substrate,
wherein each of the at least two blue fluorescent stacks comprises a blue fluorescent emission layer, the red phosphorescent stack includes a red phosphorescent emission layer and the green phosphorescent stack includes a green phosphorescent emission layer, and
wherein the blue fluorescent emission layer of each of the at least two blue fluorescent stacks, the red phosphorescent emission layer, and the green phosphorescent emission layer overlap with each other over the first, second, and the third subpixels and are vertically spaced apart from each other.

2. The display device according to claim 1, wherein
In the emission unit, the red phosphorescent stack, a first charge generation layer, a first blue fluorescent stack, a second charge generation layer, the green phosphorescent stack, a third charge generation layer, and a second blue fluorescent stack are sequentially disposed from the first, second and third anodes in a direction toward the cathode,
each of the red phosphorescent stack, the first blue fluorescent stack, the green phosphorescent stack, and the second blue fluorescent stack further comprises a first common layer under at least one emission layer, and a second common layer on at least one emission layer over the first, second and third color subpixels.

3. The display device according to claim 1, wherein
in the emission unit, the red phosphorescent stack, a first charge generation layer, a first blue fluorescent stack, a second charge generation layer, the green phosphorescent stack, a third charge generation layer, and a second blue fluorescent stack are sequentially disposed from the first, second and third anodes in a direction toward the cathode, and
the red phosphorescent stack further comprises a first blue fluorescent emission layer in contact with the red phosphorescent emission layer.

4. The display device according to claim 1, wherein the thin film transistor comprises at least one metal layer and an oxide semiconductor layer.

5. The display device according to claim 4, wherein the metal layer comprises a stack of a molybdenum oxide (MoOx) film and a copper film.

6. The display device according to claim 1, wherein a rear of the substrate is exposed to air.

7. The display device according to claim 1, further comprising:

an overcoat layer between the first, second and third color filters and the first, second and third anodes, wherein the overcoat layer is provided at a surface thereof abutting the first, second and third anodes with an irregular pattern.

8. The display device according to claim 7, wherein the first, second and third anodes, the emission unit, and the cathode are disposed along the irregular pattern of the overcoat layer.

9. The display device according to claim 1, wherein light from the emission unit is transmitted through the first, second and third anode, the first, second and third color filters, and the substrate, and luminance of passed light through the substrate is increased at a color temperature lowered from 10,000 K to 6,500 K.

10. A display device, comprising:

a first color subpixel disposed on a substrate, the first color subpixel including a first color filter and a first anode;

a second color subpixel disposed on the substrate, the second color subpixel including a second color filter and a second anode;

a third color subpixel disposed on the substrate, the third color subpixel including a third color filter and a third anode; and an emission unit including at least two blue fluorescent stacks, a red phosphorescent stack and a green phosphorescent stack, the emission structure disposed on the first anode, the second anode and the third anode; and a cathode disposed on the emission structure, wherein each of the at least two blue fluorescent stacks comprises a blue fluorescent emission layer, the red phosphorescent stack includes a red phosphorescent emission layer and the green phosphorescent stack includes a green phosphorescent emission layer, and wherein the blue fluorescent emission layer of each of the at least two blue fluorescent stacks, the red phosphorescent emission layer and the green phosphorescent emission layer overlap with each other over the first, second, and the third subpixels and are vertically spaced apart from each other.

11. The display device of claim 10, wherein:

the red phosphorescent stack, a first charge generation layer, a first blue fluorescent stack, a second charge generation layer, the green phosphorescent stack, a third charge generation layer, and a second blue fluorescent stack are sequentially disposed from the first, second and third anodes in a direction toward the cathode.

12. The display device of claim 10, wherein:

the red phosphorescent stack further comprises a first blue fluorescent emission layer in contact with the red phosphorescent emission layer.

13. The display device of claim 10, further comprising:

a hole transport common layer under each of the blue fluorescent emission layer of each of the at least two blue fluorescent stacks, the red phosphorescent emission layer and the green phosphorescent emission layer; and an electron transport common layer above each of the blue fluorescent emission layer of the at least two blue fluorescent stacks, the red phosphorescent emission layer and the green phosphorescent emission layer.

14. The display device of claim 10, wherein:

among emission layers in the emission unit, the red phosphorescent layer is closest to the first, second and the third anodes.

15. The display device of claim 10, wherein:

the first color subpixel, the second color subpixel and the third color subpixel includes an oxide thin film transistor comprising at least one oxide semiconductor layer and at least one metal layer, and the at least one metal layer comprises a stack of a molybdenum oxide (MoOx) film and a copper film is connected to first, second and third anodes.

16. The display device of claim 10, further comprising at least one thin film transistor overlapping adjacent two color filters among the first, second and third color filters.

17. The display device of claim 16, wherein the at least one thin film transistor comprises an electrode connected to first, second and third anodes, and wherein the electrode of the at least one thin film transistor comprises a stack of a molybdenum oxide (MoOx) film and a copper film.

18. The display device of claim 16, further comprising:

a passivation film between at least one thin film transistor and the first, second and third color filters, and an overcoat layer between the first, second and third color filter and the first, second and third anodes.

19. The display device according to claim 18, wherein the overcoat layer is provided at a surface thereof abutting the first, second and third anodes with an irregular pattern, wherein the first, second and third anodes, the emission unit, and the cathode are disposed along the irregular pattern of the overcoat layer.

20. The display device according to claim 10, wherein a light from the emission unit is transmitted through the first, second and third anodes, the first, second and third color filters, and the substrate, and wherein a luminance of passed light through the substrate is increased at a color temperature lowered from 10,000 K to 6,500 K.

* * * * *